(12) United States Patent
Okamoto

(10) Patent No.: US 6,369,320 B1
(45) Date of Patent: Apr. 9, 2002

(54) ENCLOSURE STRUCTURE FOR ELECTRONIC EQUIPMENT

(75) Inventor: Hiroshi Okamoto, Tokyo (JP)

(73) Assignee: Westwood, Co., Ltd., Tokyo (JP)

( * ) Notice: Subject to any disclaimer, the term of this patent is extended or adjusted under 35 U.S.C. 154(b) by 0 days.

(21) Appl. No.: 09/660,988

(22) Filed: Sep. 13, 2000

(30) Foreign Application Priority Data

Sep. 14, 1999 (JP) .......................................... 11-261034

(51) Int. Cl.[7] ............................................... H02G 3/08
(52) U.S. Cl. ....................... 174/50; 174/35 R; 174/17 R
(58) Field of Search ..................... 174/50, 52.4, 50.51, 174/17 R, 58, 53, 59, 48, 57, 65 R, 35 R; 220/3.2, 3.3, 3.94, 3.5, 3.6, 3.7, 3.8, 241; 439/131, 620, 138

(56) References Cited

U.S. PATENT DOCUMENTS

| | | | | |
|---|---|---|---|---|
| 4,215,236 A | * | 7/1980 | Reiser ........................... | 174/59 |
| 4,313,025 A | * | 1/1982 | Grube, Jr. ...................... | 174/50 |
| 5,122,068 A | * | 6/1992 | Koss ............................. | 439/98 |
| 5,414,597 A | * | 5/1995 | Lindland et al. ............. | 174/35 R |
| 5,491,614 A | * | 2/1996 | Fowler et al. ................. | 174/17 R |
| 5,670,745 A | * | 9/1997 | Yajima et al. ................. | 174/65 R |
| 5,700,976 A | * | 12/1997 | Hahn et al. .................... | 174/58 |
| 5,764,492 A | * | 6/1998 | Ady et al. ................. | 174/35 R |
| 5,786,548 A | * | 7/1998 | Fanucchi et al. | |
| 5,833,496 A | * | 11/1998 | Hollander et al. .......... | 439/620 |
| 5,864,091 A | * | 1/1999 | Sumida ........................ | 174/50 |
| 5,942,728 A | * | 8/1999 | Chen ......................... | 174/65 R |
| 5,999,406 A | * | 12/1999 | McKain et al. ............. | 439/138 |
| 6,058,024 A | * | 5/2000 | Lyford ..................... | 174/35 R |
| 6,121,548 A | * | 9/2000 | Matsuoka .................... | 174/59 |

* cited by examiner

Primary Examiner—Anthony Dinkins
Assistant Examiner—Angel R. Estrada
(74) Attorney, Agent, or Firm—Fulwider Patton Lee & Utecht, LLP

(57) ABSTRACT

In an enclosure structure for electronic equipment, operating parts of electronic components (3) operated from outside, an LCD panel (4), and connectors (5) are mounted to a printed circuit board (PCB) (1) on one and the same plane. The PCB (1) is installed within an outer enclosure formed by joining an upper housing (6) and a lower housing (7) which are formed as single elements by diecasting, the PCB (1) being mounted to lower housing (7) of the two housings. Cutouts (9a, 10a, 9b, 10b) are formed at the joining parts between the housings (6, 7), so that when the housings are joined, the operating parts of the electronic components (3) and the like are exposed to the outside at holes and windows formed by the cutouts (9a, 10a, 9b, 10b).

11 Claims, 6 Drawing Sheets

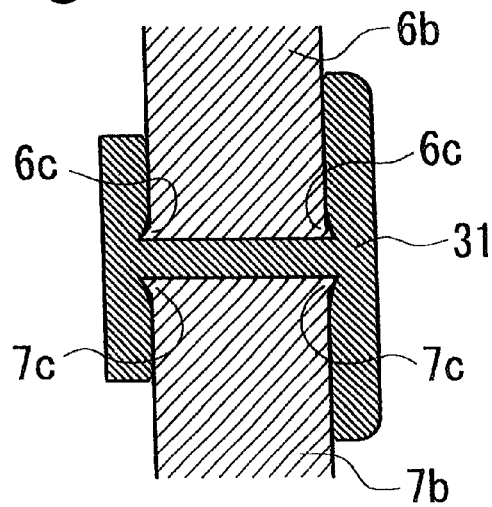
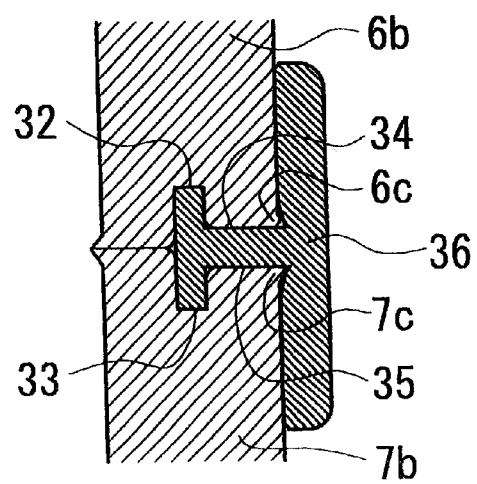
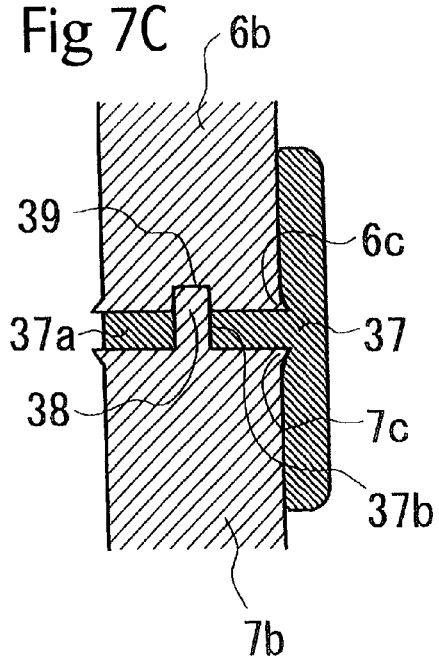
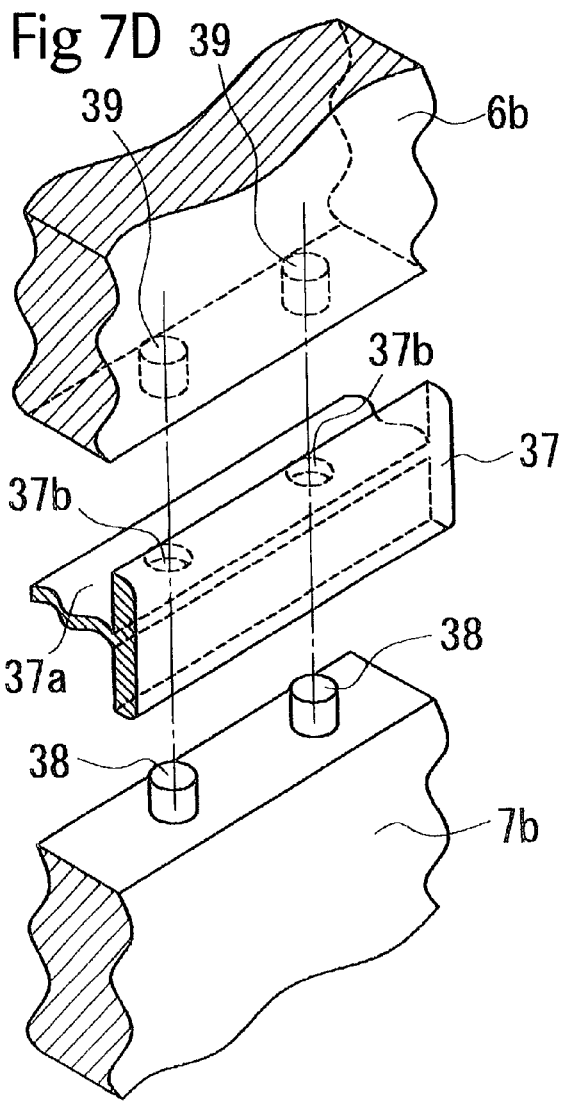

ENCLOSURE STRUCTURE FOR ELECTRONIC EQUIPMENT

BACKGROUND OF THE INVENTION

1. Field of the Invention

The present invention relates to an enclosure for a piece of electronic equipment including a printed circuit board (hereinafter called a PCB), and more particularly to an improved enclosure that both reduces the number of components making up the enclosure and simplifies its assembly.

2. Description of the Related Art

In the past, there has been a desire to reduce the number of components of and improve the efficiency of assembling a piece of electronic equipment that includes a PCB, and in particular, diecast frames and chassis with various structures have been proposed to that end (for example, as disclosed in Japanese Unexamined Patent Application publications H11-1-3177 and H7-85645).

For example, FIG. 8 and FIG. 9 show an enclosure structure that is applied in radio equipment, these drawings respectively being an outer perspective view thereof and an exploded perspective view of the constituent components thereof.

In these drawings, the reference numeral 101 denotes a diecast chassis, 102 is a PCB, 103 is an upper cover, 104 is a lower cover 105 are operating electronic components such as potentiometers, rotary encoders, and variable capacitors, 106 is a liquid-crystal display panel (hereinafter called an LCD panel), 107 is a panel circuit board, 108 is a front panel, 109 are knobs, and 110 is an acrylic sheet. The enclosure of the radio apparatus 100 is assembled by the following procedure.

First, the PCB 102 is mounted to the diecast chassis 101, this being done after a connector 102a is mounted to the PCB 102.

The panel circuit board 107 also constitutes a PCB, to which each of the operating electronic components 105 is soldered and fixed, with these electronic components passing through holes formed therein. The terminals of the operating electronic components 105 are soldered to conductive pattern parts of the panel circuit board 107, and the LCD panel 106 panel is mounted to a window formed in the panel circuit board 107.

Additionally, a cable 107a with a connector is connected to the panel circuit board 107, thereby completing the overall panel circuit board assembly 107b.

Next, there are holes and a window formed in the front panel 108 at positions corresponding to the holes and window of the panel circuit board 107, and the panel circuit board assembly 107b, to which are mounted the components 105, 106, and 107a, is mounted to the rear surface of the front panel 108, the transparent acrylic sheet 110 being mounted to the window part formed in the front surface of the front panel 108.

Then the overall front panel 108, to which is mounted the panel circuit board assembly 107b, is mounted to the front side of the diecast chassis 101, after which the cable 107a with a connector of the panel circuit board assembly 107b is connected to the connector 102a on the PCB 102 side, and if there is a connector or the like mounted to the rear surface of the diecast chassis 101, this is also connected to the PCB 102.

After the above, the upper cover 102 and the lower cover 104 are mounted to the diecast chassis 101, and finally knobs 109 are pressed onto shafts that pass through the holes in the front panel 108 and which serve as operating parts, thereby completing the radio apparatus 100 as a product.

Recently a bracket or the like for mounting discrete components has come to be fixed to the PCB 102, the components 105 being directly mounted to the PCB 102 along with an electronic circuit, so as to form an assembly, thereby simplifying the assembly procedure.

When using a diecast chassis 101 such as described with regard to the related art example, because the diecast chassis serves as a base frame that forms the enclosure, the upper and lower covers 103 and 104 and the front panel 108 become essential members of the enclosure.

Therefore, there is not only an increase in the number of components, but also an increase in the number of screw tightening locations, this leading to an inevitable increase in the work of assembling the enclosure. When a panel circuit board 107 is used, because discrete components 105, 106, and 107b are also mounted at the same time, management of components at the assembly stage becomes extremely troublesome.

Additionally, because the diecast chassis 101, the upper and lower covers 103 and 104, and the front panel 108 are each fabricated at separate diecast and sheet metal process steps, the procurement scheduling for these components also becomes troublesome.

Accordingly, it is an object of the present invention to provide a chassisless enclosure structure with an outer enclosure having a split construction, thereby providing rational solutions for the above-noted problems

SUMMARY OF THE INVENTION

The present invention is an enclosure structure for electronic equipment having an internal PCB, this structure being formed by:

a PCB having mounted to it a plurality of electronic components operable from outside, the operating parts of these electronic components being disposed on one and the same plane and extending outside the PCB; and an outer enclosure formed of a pair of diecast housings, each integrally formed by a frame-shaped side wall part and a planar part so as to enable the housing of the PCB, by joining edges of the frame-shaped side walls of each housing together;

wherein the PCB is mounted in one housing of the outer enclosure so that a plane in which the operating parts are disposed substantially coincides with an edge of the frame-shaped side wall, and cutouts are formed in edges of the housings so that, when the PCB is mounted, holes are formed in regions of the outer enclosure corresponding to the operating parts of the electronic components of the PCB.

In the enclosure structure of the present invention, a PCB is installed in the well of an outer enclosure made of a pair of diecast housings that are joined together.

A plurality of electronic components that are operated from the outside are mounted on the PCB, the operating parts of these components being disposed on one and the same plane.

Therefore, it is possible to have the joining surface of each of the housings of the outer enclosure coincide with the plane on which the operating parts of electronic components of the PCB are disposed.

If cutouts are formed in the joining plane of the housings (edges of the side wall on the frame side), taking into consideration the positions of the operating parts with the PCB mounted to one of the housings so as to be installed within the outer enclosure, holes are formed in the side wall of the outer enclosure in regions that corresponds to the positions of the operating parts, enabling the mounting of knobs onto the operating parts from outside the outer enclosure.

According to the present invention, by merely joining a pair of divided housings that form an enclosure, it is possible to achieve a chassisless structure for directly mounting a PCB to one of the housings, so that in the assembly step it is only necessary to mount the PCB to the housing and tighten the screws that join the housings.

An enclosure for electronic equipment generally has externally mounted connectors and an LCD panel. In the present invention, if these items are disposed on the same plane onto which the operating parts of the electronic components are disposed, and cutouts are formed so as to form a corresponding region of the housings to serve as holes of appropriate sizes and windows, the same method can be used to install connectors and an LCD panel to the side wall of the outer enclosure.

Additionally, because the outer enclosure is formed by a pair of housings that are split into top and bottom parts, it is possible to simplify the method of mounting the transparent sheet provided at the front surface of the LCD panel.

More specifically, a slit into which the side edge of a transparent sheet is inserted is formed in both inside surfaces of the half-frame cutout formed so as to provided a window in a region corresponding to the LCD. When the end surfaces of each housing frame side wall part are joined, this transparent sheet is inserted into the slit and the outer enclosure is assembled, thereby enabling the mounting of the transparent sheet without the need for troublesome procedures such as screw tightening or the used of an adhesive.

In manufacturing a housing by diecasting, flashing often occurs at the corner part of edge of the frame-shaped side wall.

Because the edges of the frame-shaped side walls served as the joining surfaces between the housings, this flashing can hinder the achievement of a proper joining, and can also result in dangerously sharp protrusions on the outside of the outer enclosure, making it necessary to remove such flashing.

Therefore, it is necessary to provide a separate deflashing step with respect to the housings that are obtained in the diecast step, this resulting in an increase in the manufacturing cost.

This problem can be solved by inserting a soft, belt-shaped member having an H or T cross-sectional shape between the edges of the frame-shaped side walls of the housings when joining the edges of the housings, so that the corner parts of this member minimally cover the corner part formed between the edges and the outer side wall surfaces.

According to the enclosure structure of the present invention, because the thermal capacity of the diecast housing is large and the overall outer enclosure is exposed to the outside at all times, this structure is ideal for radiating heat.

Therefore, if an electronic component that generates a large amount of heat is mounted in contact with an inner surface of one or both of the housings, it is possible to achieve highly efficient radiation of heat. If heat-radiating fins are additionally formed integrally with the diecast housing, on the outer surface thereof, it is possible to achieve a further improvement in heat radiating effectiveness.

BRIEF DESCRIPTION OF THE ACCOMPANYING DRAWINGS

FIG. 7 shows a variety of methods of inserting a belt-shaped member between the joined surface of the housings.

FIG. 7(A) is a partial cross-section view for the case in which the belt-shaped members of FIG. 5 is inserted.

FIG. 7(B) is a partial cross-section view for the case in which electrical conductivity is maintained between the housings while inserting between the joined surfaces thereof a belt-shaped member having an H-shaped cross-section.

FIG. 7(C) is a partial cross-section view showing the case in which a belt-shaped member having a T-shaped cross-section is inserted.

FIG. 7(D) is a partial perspective view showing the configuration of the housings and the belt-shaped member with a T-shaped cross-section in the insertion method shown in FIG. 7(C).

DETAILED DESCRIPTION OF THE PREFERRED EMBODIMENTS

A preferred embodiment of an enclosure structure for electronic equipment according to the present invention is described in detail below, with references being made to relevant accompanying drawings.

Figure 1:
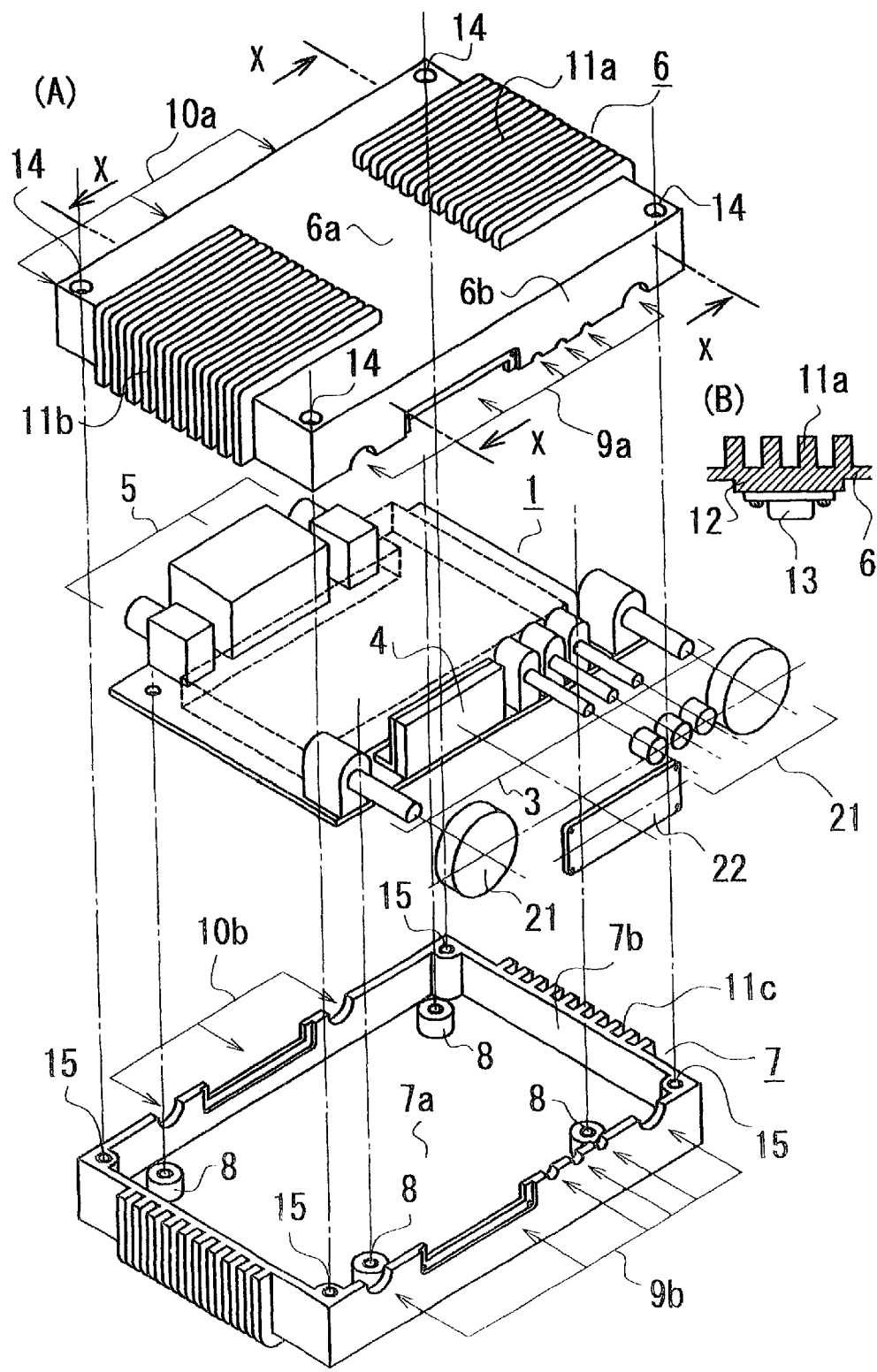
FIG. 1(A) is an exploded perspective view of an enclosure structure according to an embodiment of the present invention.
FIG. 1(B) is a cross-section view along the cutting line X—X in FIG. 1(A).

FIG. 1(A) is an exploded perspective view of an enclosure of a radio apparatus according to an embodiment of the present invention.

In FIG. 1(A), the reference numeral 1 denotes a PCB, onto which the main electronic components, such as ICs and discrete components, are mounted.

Features of the PCB 1 in this embodiment include the mounting thereto of electronic components 3, operated from outside, such as rotary encoders and rotary switches used for tuning and band selection, an LCD panel 4, and connectors 5, and the fact that the centers of the shafts of the operating parts of these components 3, 4, and 5 are one and the same plane, which is parallel to the PCB plane.

The reference numerals 6 and 7 denoted upper and lower housings, respectively, these being formed by a diecasting method of magnesium, a magnesium alloy, or an aluminum alloy.

It there basic form, the housings 6 and 7 are formed, respectively, by frame-shaped side walls 6b and 7b, and by planar parts 6a and 7a, these being of dimensions that allow the housing of the PCB 1 therewithin, the two housings forming a box-shaped outer enclosure by being joined at the edges of the frame-shaped side walls thereof.

The housings 6 and 7 have the following characteristics.

(1) Four studs 8 for the purpose of mounting the PCB 1 during the manufacturing process are integrally formed on the inner surfaces of the planar part 7a of the housing 7, so that when the PCB 1 is mounted to the studs 8, the plane that includes the operating parts of the components 3, 4, and 5 and the center point and the like substantially coincides with edge of the frame-shaped side wall 7b of the housing 7.

(2) Semicircular or rectangular cutouts 9a, 10a, 9b, and 10b are formed in the edges of the frame-shaped side walls 6b and 7b of the housings 6 and 7, so that, with the PCB 1 mounted to the housing 7, when the housings 6 and 7 are joined to form the outer enclosure, holes and windows are formed in areas that correspond to the operating parts of the components 3, 4, and 5 of the PCB 1 in the outer enclosure.

(3) Heat-radiating fins 11a, 11b, 11c, and 11d are formed on the outer surfaces of the housings 6 and 7, and a mounting location 12 is formed on the inner surface of the upper housing 6 at a position that corresponds to the heat-radiating fins 11a and 11b of the housing, enabling the mounting of a component radiating a large amount of heat, such as a power transistor 13, to the mounting location 12. FIG. 1(B) shows a cross-section view in the direction of the X—X arrows in FIG. 1(A), this indicating the above-noted mounting location.

(4) Through holes 14 for screw joining to the lower housing 7 are formed in the four corners of the upper housing 6, and threaded holes 15 are formed in the four corners of the lower housing 7 at locations opposite the holes 14 of the upper housing 6, so that the housings 6 and 7 are held together by joining the frame-shaped side walls 6b and 7b of the housings 6 and 7 and tightening them to each other by screws (not shown in the drawing) that are inserted through the through holes 14 from the upper housing side.

Based on the foregoing, by performing assembly by mounting the PCB 1 to the lower housing 7 and screw-mounting the upper housing 6 onto the lower housing 7, the operating parts and the like of the components 3, 4, and 5 of the PCB 1 at the joined part of the housings 6 and 7 there are holes and windows at positions that correspond to the operating parts, thereby exposing the operating parts and the like to the outside through these holes and windows.

Figure 2:
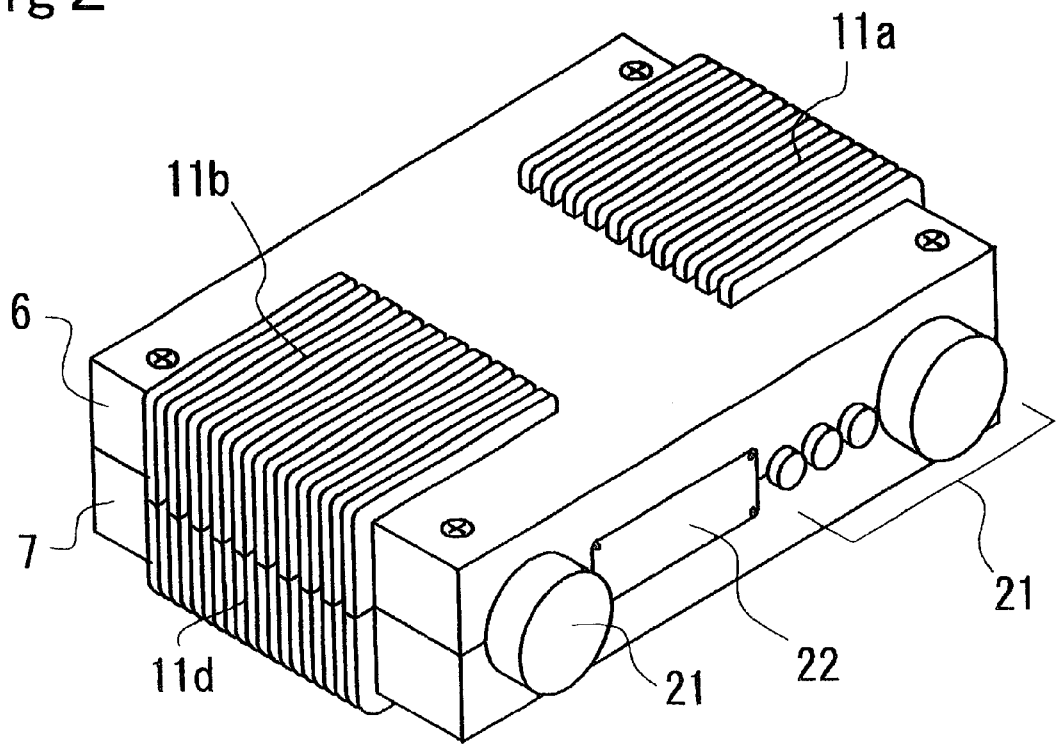
FIG. 2 is a outer perspective view of a completed radio apparatus.

Therefore, by mounting knobs 21 to the operating parts by pressing the knobs thereonto, and by mounting a transparent acrylic sheet 22 to the window part at which the LCD panel 4 is exposed from inside, the completed radio apparatus is finished as a product as shown in FIG. 2.

In additional to pre-painting the surfaces of the housings 6 and 7, functional markings and scales related to the operating parts are printed or filled with paint in proximity to the holes or windows, taking into consideration the size of the knobs 21 and the positions of the components 3, 4, and 5.

According to the enclosure structure of a radio apparatus according to the present invention, by joining of the housings 6 and 7, because the PCB 1 is directly mounted to the lower housing 7, which is a constituent part of the outer enclosure, a chassis is formed.

Additionally, because electronic components 3 that are operated from the outside, the LCD panel 4, and connectors 5 are pre-assembled to the PCB 1, the number of components at the time of assembly is extremely small, so that when the PCB 1 is mounted during assembly, all that is required is the simple operation of joining the housings 6 and 7 and holding them together using screws, and the mounting of knobs.

Additionally, because the outer enclosure can be used as is as a heat-radiating member with high thermal capacitance, it is possible to achieve efficient heat radiation from components such as a power transistor 13.

The outer enclosure in the above-noted embodiment is a split structure made up of an upper housing and a lower housing, with the operating parts of electronic components positioned at holes at the joined surfaces between the split parts.

Figure 3:
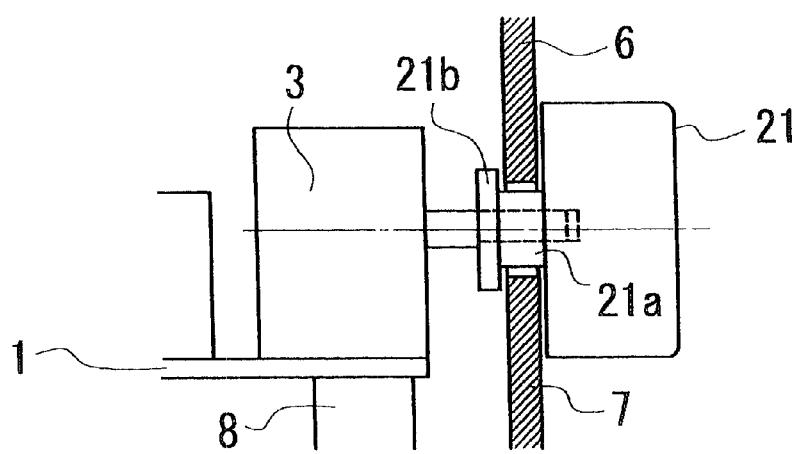
FIG. 3 is a partial cross-section view of a structure for preventing a knob from being pulled off.

Therefore, as shown in FIG. 3, the parts of the operating parts of the electronic components onto which knobs 21 are pressed is formed by a sleeve 21a that is made slightly longer than the thickness of the upper and lower housings 6 and 7, and the diameters thereof are made slightly smaller than the diameters of the holes in the outer enclosure, and a flange 21b having a diameter that is larger than the diameter of the hole in the outer enclosure, so that if the knobs 21 being mounted to the operating parts of the electronic components 3 before mounting the PCB 1 to the lower housing 6, and the resulting PCB and knob sub-assembly is installed within the upper and lower housings 6 and 7 in this condition, the knobs 21 are prevented from falling off by the outer enclosure.

Figure 4:
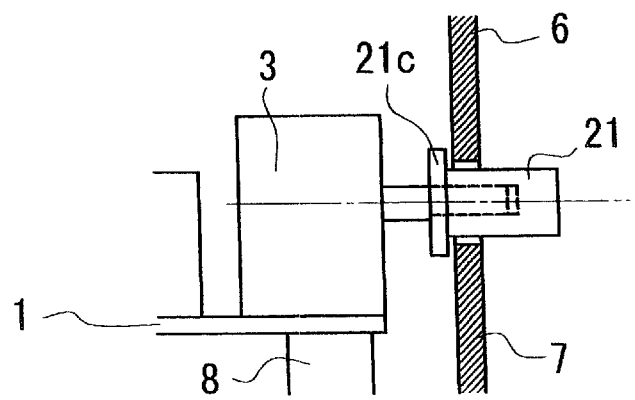
FIG. 4 is a partial cross-section view of a structure for preventing a knob from being pulled off.

FIG. 4 shows the condition in which the diameter of a knob is smaller than the diameter of the hole in the outer enclosure, in which the knob 21 can be mounted to a flange 21c in the same manner as described above, thereby achieving the same function.

Figure 5:
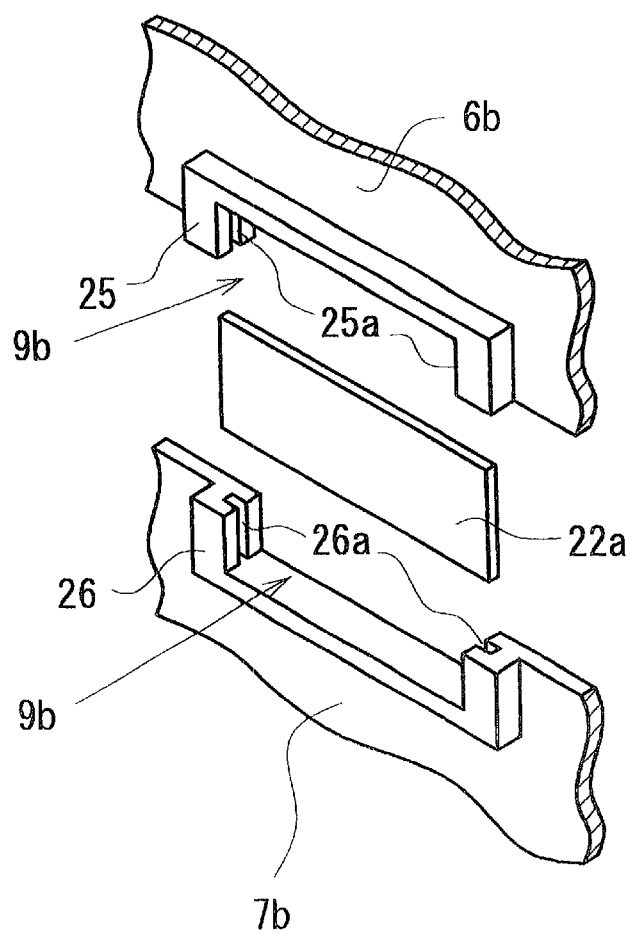
FIG. 5 is a partial perspective view showing a method of attaching a transparent acrylic sheet to a window.

While in the above-described embodiment, it is assumed with regard to the method of mounting the transparent acrylic sheet 22 to the window at which the LCD panel 4 is exposed at the front of the enclosure that the acrylic sheet 22 is either held to the cutouts 9a and 9b by a screw or held to one cutout 9b by an adhesive, using the fact that the outer enclosure is of split construction, it is alternately possible to use the method shown in FIG. 5.

First, when forming the cutouts 9a and 9b to serve as a window in the frame-shaped side walls 6b and 7b of the diecast housings 6 and 7, half-frame parts 25 and 26, which are thicker than other parts of the wall are provided, and internal slits 25a and 26a are formed in both sides of the half-frame parts 25 and 26, so that the edge of the transparent acrylic sheet 22a can be inserted thereinto.

When joining the edges of the frame-shaped side walls 6b and 7b of the housings 6 and 7, if the transparent acrylic sheet 22a is first inserted into the slits 25a and 26a, the transparent acrylic sheet 22a will be held within a window formed by the half-frame parts 25 and 26.

In the above-noted case, when designing the die for forming the housings 6 and 7, it is only necessary to add the parts for the half-frame parts 25, and it is not necessary to tighten screws or mount with an adhesive when assembling the outer enclosure, thereby reducing both the number of parts and the number of assembly steps.

If the thickness of the frame-shaped side walls 6b and 7b of the housings 6 and 7 is sufficient larger than the thickness of the transparent acrylic sheet 22a, it is not necessary to increase the thickness of the half-frame parts 25 and 26 to larger than other parts of the wall, enabling the formation of the slits 25a and 26a in the frame-shaped side walls 6b and 7b as is.

In the above-described embodiment, the upper and lower housings 6 and 7 are formed by diecasting, which inevitably is accompanied by the formation of flashing at the corner parts of the frame-shaped side walls 6b and 7b.

In the above-noted case, if flashing occurs that protrudes to the outside, there will be a sharp protrusion on the outside of the outer enclosure, this presenting a danger to the operator of the apparatus.

The occurrence of such flashing also hinders the achievement of a good joint at the joining surfaces 6b and 7b between the housings 6 and 7, resulting in a gap between the housings 6 and 7 when they are joined to form the outer enclosure, thereby detracting from the outer appearance of the apparatus. Additionally, this gap can allow moisture or dust and the like to intrude into the apparatus, leading to failures of internal electronic components.

To counteract the above-noted phenomenon, one approach that can be envisioned is that of performing removal of the flashing at the finishing step in forming the diecast housings 6 and 7. Achieving flatness at each of the joining surfaces, however, is extremely troublesome, requiring considerable time and effort.

Figure 6:
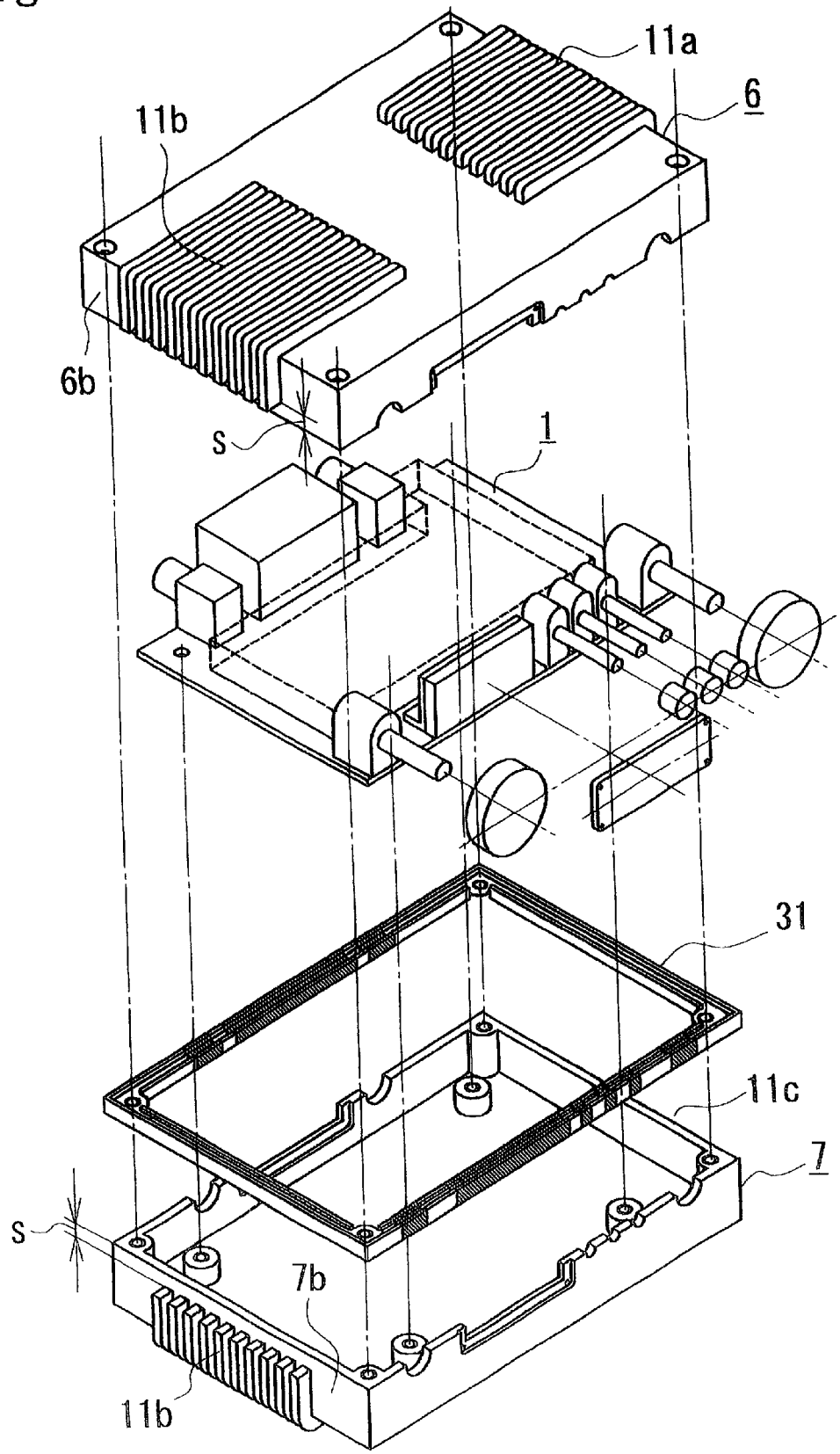
FIG. 6 is an exploded perspective view a enclosure structure for the case in which an belt-shaped member with an H-shaped cross-section is inserted between the joined surfaces of the housings.
Figure 8:
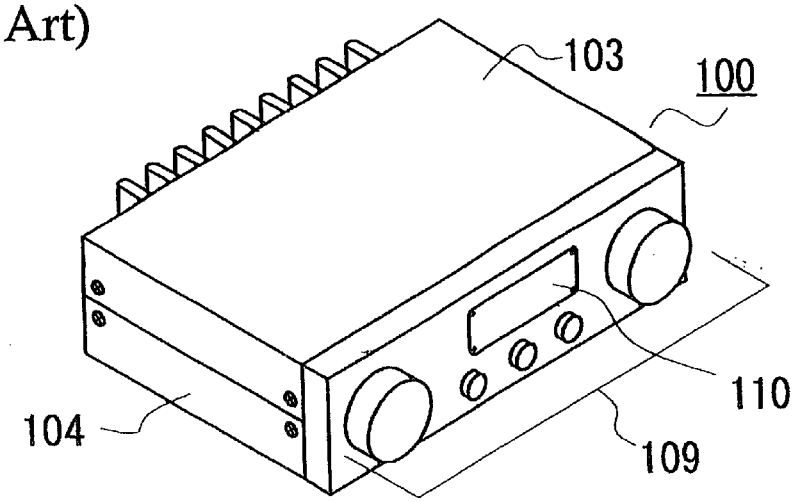
FIG. 8 is an outer perspective view showing a radio apparatus using an outer enclosure of the past.
Figure 9:
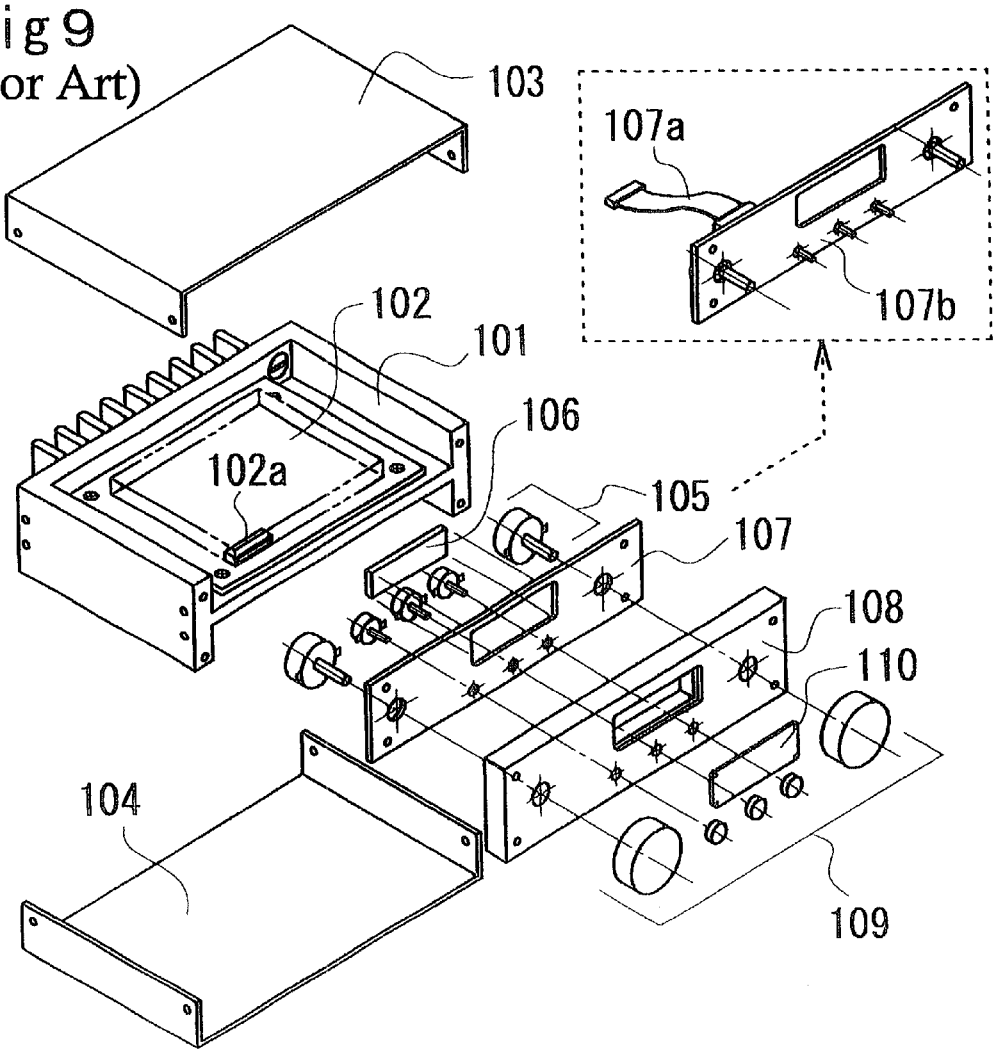
FIG. 9 is an exploded perspective view of the outer enclosure used in the radio apparatus of FIG. 8.

Accordingly, as shown in FIG. 6, when joining the upper housing 6 to the lower housing 7, if a belt-shaped rubber or synthetic resin member 31 with an H-shaped cross-section is inserted between the housings, it is not necessary to consider the above-noted problems that flashing could cause, and it is possible to eliminate the above-noted finishing step, thereby representing a simplification of the manufacturing process.

More specifically, as shown in FIG. 7(A), if the housings 6 and 7 are joined as the edges of the frame-shaped side walls 6b and 7b thereof are covered by the belt-shaped member 31, the edges of the frame-shaped side walls 6b and 7b fit into the depressions in the sides of the H-shaped belt member 31 as the housings 6 and 7 are joined together, so that the corners 6c and 7c of the frame-shaped side walls 6b and 7b are not exposed to the outside.

Additionally, as shown in FIG. 6, if the heat-radiating fins 11a, 11b, 11c, and 11d of the housings 6 and 7 are formed so that they extend only to a prescribed distance S from the edge of the frame-shaped side walls 6b and 7b, it is possible to form the belt-shaped member 31 with a uniform cross-section shape.

In the actual step of assembly, the belt-shaped member 31 is mounted to the edge of either the housing 6 or the housing 7 along the frame shape continuously, after which areas (shown by hatching on the belt-shaped member 31 in FIG. 6) corresponding to the cutouts 9a, 10a, 9b, and 10b in the housings 6 and 7 are cut away from the belt-shaped member 31.

Using this method, by using an electrically conductive rubber or an electrically conductive resin for the belt-shaped member 31, it is possible to establish an electrical connection between the upper and lower housings 6 and 7.

Rather than the method described above, it is possible, as shown in FIG. 7(B), to form priorly grooves 32 and 33 in the edges of the frame-shaped side walls 6b and 7b along the longitudinal direction, and to form stepped surfaces 34 and 35, the outside surfaces of which are slight lower than the grooves 32 and 33, after which part of a belt-shaped member 36 having an H-shaped cross-section is fitted into the grooves 32 and 33, so that the belt-shaped member 36 is disposed between the edges of the frame-shaped side walls 6b and 7b of the housings 6 and 7.

In the above-noted case, similar to the case shown in FIG. 7(A), because the corners 6c and 7c on the outside of the frame-shaped side walls 6b and 7b are covered by the belt-shaped member 36, and the edges of the frame-shaped side walls 6b and 7b are in direct contact further inside from the grooves 32 and 33, mutual electrical connection is established between the housings 6 and 7.

Additionally, as shown in FIG. 7(C) and FIG. 7(D), it is alternately possible to use a belt-shaped member 37 having a T-shaped cross-section.

In this method, small protrusions 38 are formed at a prescribed spacing along the edge of the frame-shaped side wall 7b of the housing 7, depressions 39 are formed along the edge of the frame-shaped side wall 6b of the housing 6, at positions corresponding to the protrusions 38 on the housing 7, so the protrusions fit thereinto, and holes 37b are formed along the sandwiched part 37a of the belt-shaped member 37 which fits between the housings 6 and 7, at the same corresponding positions, so that the protrusions 38 pass therethrough.

As shown in FIG. 7(C), when the sandwiched part 37a of the belt-shaped member 37 is fitted between the edges of the frame-shaped side walls 6b and 7b of the housings 6 and 7, the outer corners 6c and 7c of the frame-shaped side wall 6b and 7b are covered by the belt-shaped member 37.

In this case as well, it is possible to fabricate the belt-shaped member from an electrically conductive material.

While the foregoing embodiment is described for the case of a single PCB 1, it will be understood that the present invention can also be applied to the case of a plurality of PCBs, as long as the required relationship of each PCB to the outer enclosure is satisfied, in which case it is also possible to mount some of the PCBs to the upper housing 6 and some of the PCBs to the lower housing 7.

Additionally, while the foregoing embodiment is described for the case in which the electronic components 3 operating from outside are rotary type components, it will be understood that the present invention can be applied in the same way for pushbutton type components.

Additionally, while the foregoing embodiment is described for the case in which electronic components and the like are exposed on only the front and rear sides of the outer enclosure, it will be understood that the chassisless structure of the present invention can be applied in the same manner to the case in which operating electronic components are exposed at a side of the outer enclosure as well. It is therefore easy to configure an easy-to-operate radio apparatus which enables adjustment of a knob provided on a side thereof while observing a display on the front thereof. This gives the designer great freedom in designing an operating layout to meet diverse requirements.

By adopting the configuration described in detail above, an enclosure structure for electronic equipment according to the present invention provides the following effects.

The present invention as recited in claims 1 and 2 of the accompanying claims provides a chassisless enclosure structure that features a reduced number of parts at assembly time, and a greatly reduced number of assembly steps, thereby achieving a reduction in overall manufacturing cost.

Where as past use of a diecast frame or diecast chassis required covers and front panels that were fabricated by sheet metal or machining steps, with the present invention these become unnecessary, thereby facilitating management of parts procurement scheduling.

Additionally, because the outer enclosure has a split structure formed by a pair of housings, it is possible to prevent pulloff of knobs, regardless of their diameters, in addition to the advantage of ease in providing operating parts on the outside of the outer enclosure.

In the present invention as recited in claim 3 of the accompanying claims, using the fact that the outer enclosure has a split structure formed by a pair of housings, the mounting of a transparent sheet provided at the front of an LCD panel is simplified, and the number of parts and process steps is reduced.

In the present invention as recited in claim 4 of the accompanying claims, even though sharp flashing inevitably occurs on the corners parts of the joined surfaces of the diecast housings, these not only presenting a dangerous element when the housings are used in an outer enclosure, but also hindering the establishment of a good joint between the housings, by inserting a belt-shaped member having an H-shaped or T-shaped cross-section between the housings, this problem is solved without having to perform a troublesome flashing removal step.

In the present invention as recited in claims 5 and 6 of the accompanying claims, making use of the ability of a diecast housing forming the outer enclosure to serve as a good heat-radiating element, highly efficient heat radiation is achieved with respect to an internal electronic component that generates a large amount of heat. If, as recited in claim 6, heat-radiating fins are provided on the outer surface of the housing, in addition to increasing the heat-radiating effect, it is possible to impart a unique design to the outer enclosure.

What is claimed is:

1. An enclosed electronic apparatus comprising:

a printed circuit board (PCB) in electrical communication with a plurality of spaced apart electronic components having corresponding operational parts extending therefrom in a common plane;

an enclosure forming an interior chamber dimensioned to house said PCB, said enclosure including first and second halves, the respective said halves being integrally formed by a planar part and a side wall part terminating in an edged surface having a complementary cutout region, at least one of said planar parts being constructed to support said PCB therefrom;

said halves cooperating to form said interior chamber by abuttingly engaging their respective said edged surfaces in a plane substantially coinciding with said common plane and aligning said complementary cutout regions of said side walls to form a plurality of apertures constructed to receive a first portion of said operational parts when said PCB is mounted in said chamber; and whereby, upon mounting said PCB to said planar part of one of said halves, respective said edged surfaces may be joined together to enclose said PCB and align said respective cutout regions disposing said first portion of respective said operational parts within corresponding respective said apertures and a second portion of said operational parts positioned exterior to said inner chamber.

2. An enclosed electronic apparatus according to claim 1 wherein:

said PCB includes an electrical component with a display face for facing outward from said enclosure and including a midpoint passing through said common plane; and at least one of said apertures is dimensioned for receipt of said display panel.

3. An enclosed electronic apparatus according to claim 2, wherein:

a pair of slits are formed in opposing inside surfaces of said panel receiving aperture for receipt of a side edge of a transparent sheet for covering said display panel; and whereby upon joining said edged surfaces of each of said side wall parts, said transparent sheet may be retained within said slits.

4. An enclosed electronic apparatus according to claim 1 wherein:

at least one of said electronic components capable of generating heat to be dissipated is mounted in contact with an inner surface of at least one of said halves.

5. An enclosed electronic apparatus according to claim 1 wherein:

a heat-radiating fin is integrally formed onto an outside surface of at least one of said halves.

6. An enclosed electronic apparatus according to claim 1 wherein:

a compressible belt-shaped member having a predetermined cross-section is disposed between said edged surfaces of said side walls of said halves when said halves are assembled and further including a covering flange positioned against a portion of the exterior surface of said side walls.

7. An enclosed electronic apparatus according to claim 6 wherein:

said belt-shaped member is electrically conductive.

8. An enclosed electronic apparatus according to claim 6 wherein:

said predetermined cross section is substantially H-shaped.

9. An enclosed electronic apparatus according to claim 6 wherein:

said predetermined cross section is substantially T-shaped.

10. An enclosed electronic apparatus according to claim 1 wherein:

at least one of said apertures is circular.

11. An enclosure apparatus for enclosing electronic equipment including a printed circuit board (PCB) and operational parts extending therefrom in a common plane, said enclosure comprising:

a first enclosure half having a planar mounting surface bordered by a plurality of side walls projecting orthogonally therefrom and terminating in a first abutment surface, at least one of said side walls including a first set of cutouts having an outermost extent aligned in a plane passing through said first abutment surface, said mounting surface providing a mounting region for said PCB;

a second enclosure half having a base surface supporting a plurality of side walls projecting therefrom and terminating in a second abutment surface, at least one of said side walls including a second set of cutouts formed to complement said first set of cutouts and form a set of apertures configured with a preselected shape including at least one circular aperture to receive a portion of said operational parts when said enclosure halves are aligned and said first and second abutment surfaces are joined;

a fastener element for fastening said first enclosure half to said second enclosure half, and whereby said PCB may be mounted to said mounting region and said first and second enclosure halves fastened together with said first and second cutout sets being aligned to form said apertures for surrounding a portion of said operational parts and further aligning said common plane with a plane passing through the mating of said first and second abutment surfaces.

* * * * *